United States Patent
Camalleri et al.

(10) Patent No.: US 6,642,121 B2
(45) Date of Patent: Nov. 4, 2003

(54) CONTROL OF AMOUNT AND UNIFORMITY OF OXIDATION AT THE INTERFACE OF AN EMITTER REGION OF A MONOCRYSTALLINE SILICON WAFER AND A POLYSILICON LAYER FORMED BY CHEMICAL VAPOR DEPOSITION

(75) Inventors: Cateno M. Camalleri, Catania (IT); Simona Lorenti, Catania (IT); Denise Cali', Catania (IT); Patrizia Vasquez, Acireale (IT); Giuseppe Ferla, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/032,334

(22) Filed: Dec. 18, 2001

(65) Prior Publication Data

US 2002/0155673 A1 Oct. 24, 2002

(30) Foreign Application Priority Data

Dec. 20, 2000 (EP) ............................................. 00830834

(51) Int. Cl.⁷ .......................................... H01L 21/8222
(52) U.S. Cl. ...................... 438/368; 438/743; 438/756
(58) Field of Search ................................ 438/365, 368, 438/743, 756, FOR 186

(56) References Cited

U.S. PATENT DOCUMENTS

| | | | |
|---|---|---|---|
| 4,062,707 A | * 12/1977 | Mochisuki et al. | 438/551 |
| 4,784,975 A | * 11/1988 | Hofmann et al. | 438/308 |
| 5,023,206 A | * 6/1991 | Freeman | 438/723 |
| 5,194,397 A | * 3/1993 | Cook et al. | 438/684 |
| 5,244,843 A | * 9/1993 | Chau et al. | 438/452 |
| 5,326,722 A | * 7/1994 | Huang | 438/299 |
| 5,340,765 A | * 8/1994 | Dennison et al. | 438/398 |
| 5,352,636 A | * 10/1994 | Beinglass | 438/475 |
| 5,891,809 A | * 4/1999 | Chau et al. | 438/770 |
| 5,899,752 A | * 5/1999 | Hey et al. | 438/791 |
| 6,245,616 B1 | * 6/2001 | Buchanan et al. | 438/287 |
| 6,300,210 B1 | * 10/2001 | Klootwijk et al. | 438/372 |

FOREIGN PATENT DOCUMENTS

EP       0 519 854       12/1992       ......... H01L/21/225

OTHER PUBLICATIONS

Abdul Rahim et al: "Improved control of polysilicon emitter interfacial oxide using a UHV-compatible LPCVD cluster tool", 1997 EDMO workshop on London, UK Nov. 24–25, 1997, New York, USA, IEEE Nov. 24, 1997, pp. 232–236, ISBN: 0–7803–4135.

Yoon et al.: "High–Field–Induced Leakage in Ultrathin $N_2O$ Oxides", IEEE Inc., vol. 14, No. 5, May 1, 1993, pp. 231–233; ISSN: 0741–3106.

Patent abstract of Japan, vol. 007, No. 292 published Oct. 4, 1983, publication #58169275.

* cited by examiner

Primary Examiner—Olik Chaudhuri
Assistant Examiner—Joannie Adelle Garcia
(74) Attorney, Agent, or Firm—Lisa K. Jorgenson; Allen, Dyer, Doppelt, Milbrath & Gilchrist, P.A.

(57) ABSTRACT

A method of controlling the quantity and uniformity of distribution of bonded oxygen atoms at the interface between the polysilicon and the monocrystalline silicon includes carrying out, after having loaded the wafer inside the heated chamber of the reactor and evacuated the chamber of the LPCVD reactor under nitrogen atmosphere, a treatment of the wafer with hydrogen at a temperature generally between 500 and 1200° C. and at a vacuum generally between 0.1 Pa and 60000 Pa. The treatment is performed at a time generally between 0.1 and 120 minutes, to remove any and all the oxygen that may have combined with the silicon on the surface of the monocrystalline silicon during the loading inside the heated chamber of the reactor even if it is done under a nitrogen flux. After such a hydrogen treatment, another treatment is carried out substantially under the same vacuum conditions and at a temperature generally between 700 and 1000° C. with nitrogen protoxide ($N_2O$) for a time generally between 0.1 and 120 minutes.

18 Claims, 6 Drawing Sheets

CONTROL OF AMOUNT AND UNIFORMITY OF OXIDATION AT THE INTERFACE OF AN EMITTER REGION OF A MONOCRYSTALLINE SILICON WAFER AND A POLYSILICON LAYER FORMED BY CHEMICAL VAPOR DEPOSITION

FIELD OF THE INVENTION

The present invention relates to fabrication techniques of integrated semiconductor devices and in particular to fabrication techniques of poly-emitter bipolar devices.

BACKGROUND OF THE INVENTION

Bipolar devices with doped polycrystalline silicon (polysilicon) emitters, commonly referred to as poly-emitter bipolar devices, and typically bipolar transistors, are very numerous in many integrated circuits designed for operating at radio frequency because they permit the formation of exceptionally shallow emitter junctions and of self aligned structures with modern fabrication techniques. Moreover, poly-emitter bipolar transistors provide for a higher switching speed and a higher current gain (HFE), in common emitter configuration, substantially without increasing the base resistance, than their counterparts with a more conventional structure.

It has been established that the higher current gain property is tied to the presence of a very thin layer of silicon oxide (one or few mono-layers) at the interface between the monocrystalline silicon of the emitter area of the semiconductor substrate and the polysilicon layer deposited on it. For example, see A. K. Kapoor and D. J. Roulston, "Poly-silicon Emitter Bipolar Transistors", 1989 IEEE Press.

Several physical models have been devised to describe such an interface oxide layer as a tunnel barrier for holes, so justifying the increment of the current gain when the base current decreases. Distribution diagrams of holes in a poly-emitter device are depicted in FIG. 1, while the holes distribution in the polysilicon layer is depicted in FIG. 2.

In the case depicted in FIGS. 1 and 2, both the emitter resistance (RE) as well as the current gain (HFE) depend strongly by the barrier characteristics of the oxide film at the interface. In general RE and HFE are proportional to the expression:

$$e^{A\delta\sqrt{B\chi}}$$

wherein $\delta$ and $\chi$ represent respectively the thickness and the highness of the barrier and A and B are constants.

Naturally, for a standard thermal oxide, $\chi$ is about 0.6 eV for electrons and 1.1 eV for holes, but, in the case of the oxide that is presumed to be present at the interface between the monocrystalline silicon and the polysilicon upon detecting a certain amount of oxygen, per unit area these values appear to be markedly depressed because of the non-stoichiometric form of such an interface oxide. For this reason, the trade-off between the RE and HFE values depends on the barrier property of the interface film of oxidized silicon though the HFE shows an increasingly marked increase upon an increase of the amount or "thickness" of the interface oxide (or more precisely of the concentration of oxygen atoms per unit area).

The main technical problem in fabricating this kind of integrated structure is represented by the difficulty of controlling the physical-chemical characteristics of the interface, in consideration of the commonly used techniques for depositing the polysilicon that typically are based on a low pressure chemical vapor deposition process (LPCVD). In poly-emitter bipolar devices, the presence at the interface of an amount of oxygen comprised between 1 and $2\times10^{15}$ oxygen atoms per $cm^2$ of interface area has been instrumentally measured by NRA (Nuclear Reaction Analysis).

The values of oxygen concentration at the interface, measured by the NRA technique, are reported in FIG. 3 together with the measured values of HFE for different devices, in which the interface had been subjected to different process conditions. It can be seen clearly that the values of HFE depend strongly on the amount of oxygen at the interface and that even small differences produce remarkable variations of the current gain. To obtain acceptable HFE values (100±30), the oxygen concentration at the interface must be between 1 and $2\times10^{15}$ atoms/$cm^2$.

Conventional fabrication processes may contemplate a treatment of the surface of the monocrystalline silicon in the emitter area with a diluted solution of hydrofluoric acid (commonly 1% by weight) before introducing the wafer in the polysilicon LPCVD reactor. Hydrogen passivation of the silicon surface by contacting it with hydrofluoric acid is effective in limiting a spontaneous re-oxidation of the silicon surface exposed to air at room temperature.

Nevertheless, during the loading of the wafer inside the heated chamber of the LPCVD reactor and while evacuating the reactor, the monocrystalline silicon surface oxidizes freely determining a wide dispersion of the values of the current gain of the transistors so fabricated. A typical LPCVD reactor is depicted in FIG. 4. A typical LPCVD process for depositing a layer of polysilicon is illustrated in a general manner in the following table, though conditions of each of the 14 phases may be slightly different, depending on the type of device being integrated and on the fabrication technology.

| | | |
|---|---|---|
| BOAT IN | BOAT = 60 | 35 cm/min |
| T = 620° C. | BOAT = 5 | 25 cm/min |
| | BOAT IN | 5 cm/min |
| | H1 – N2 = ON | |
| T1 | t = 3 min | |
| PRE-VACUUM | H GATE = ON | |
| T2 | t = 4 min | |
| VACUUM | GATE V = ON | |
| T3 | t = 4 min | |
| LEAK-CHECK | GATE V = OFF | |
| T4 | t = 30 s | |
| VACUUM | GATE V = ON | |
| T5 | t = 30 min | |
| TEMP-STAB 1 | Low N2 = 200 sccm | |
| CONTROL: TC SPIKE | (flux measure) | |
| | N2 dil = 200 scm | |
| T6 | t = 30 min | |
| TEMP-STAB 2 | Low N2 = 200 sccm | |
| CONTROL: TC SPIKE | N2 dil = 200 scm | |
| T7 | t = 4 s | |
| PRE-DEP | SiH4 US = OFF | |
| | SiH4 D = 36 sccm | |
| | SiH4 I = 44 sccm | |
| | N2 dil = 200 scm | |
| T8 | t = 40 min | |
| DEPOSITION | SiH4 US = ON | |
| | SiH4 D = 36 sccm | |
| | SiH4 I = 44 sccm | |
| | N2 dil = 200 scm | |
| T9 | t = 100 s | |
| POST DEP | SiH4 US = OFF | |
| | SiH4 D = 0 sccm | |
| | SiH4 I = 0 sccm | |
| | N2 dil = 200 scm | |

-continued

| | |
|---|---|
| T10 | t = 5 min |
| PURGE | Low N2 = 200 sccm |
| | N2 dil = 25O scm |
| HOLD | MANUAL START |
| | Low N2 = 200 sccm |
| | N2 dil = 250 scm |
| T11 | t = 13 min |
| VENT | N2 = 5 slm |
| BOAT OUT | H1 – N2 = ON |
| | BOAT = 25 cm/min |

To limit oxidation of the monocrystalline silicon surface during the loading inside the heated chamber of the reactor and during evacuation of the chamber, a common practice is to maintain the wafer in an atmosphere of inert gas, such as nitrogen ($N_2$), helium or argon during loading and evacuation. By introducing nitrogen ($N_2$) the availability of oxygen or of any other oxidant in the atmosphere inside the reactor may be greatly reduced thus preventing excessive oxidation of the silicon while heating up to the chamber's temperature. This well known technique for reducing the concentration of oxidant inside the chamber of the LPCVD reactor and eventually of the chamber's temperature when loading the wafers, tends to produce excessively low gain values of the transistors.

To overcome this drawback, it has been proposed to "condition" the surface of the monocrystalline silicon wafer, before introducing it in the LPCVD reactor for depositing the polysilicon, by chemically oxidizing the silicon surface previously passivated by treatment with hydrofluoric acid, using hydrogen peroxide ($H_2O_2$). This technique, even if it ensures the presence of an adequate amount of native oxide at the interface between the monocrystalline silicon and the polysilicon layer, produces an excessive dispersion of the current gain values (HFE).

Moreover, the pre-oxidation treatment with $H_2O_2$ requires sophisticated control devices because of the remarkable reactivity of silicon even at low temperature. In fact, even if a residual hydrogen passivation of the surface of the monocrystalline silicon may be still found up to a temperature of about 300° C., it has been demonstrated that silicon begins to oxidize well before hydrogen passivation of its surface has completely disappeared.

A thermal oxidation pre-treatment in presence of oxygen and/or steam of the monocrystalline silicon surface to prevent an uncontrolled oxidation during loading, heating and evacuating of the chamber of the LPCVD reactor of polysilicon deposition is not practicable because of the very fast kinetics of the thermal oxidation process that make a precise control, for the extremely small amount of it that is required, almost impossible or at least extremely difficult. Moreover, the presence of an oxidizing atmosphere inside the LPCVD reactor itself would be hardly compatible with the silicon precursor compounds ($SiH_4$) from the point of safety.

SUMMARY OF THE INVENTION

There is a need for an improved process in which the amount and uniformity of distribution of a native oxide at the interface between the emitter region of a monocrystalline silicon wafer and the polysilicon layer deposited thereon by a low pressure chemical vapor deposition technique may be effectively controlled.

The process of the present invention substantially eliminates the above mentioned problems of controlling the quantity and uniformity of distribution of bonded oxygen atoms at the interface between the polysilicon and the monocrystalline silicon by carrying out, after having loaded the wafer inside the heated chamber of the reactor and evacuated the chamber of the LPCVD reactor under nitrogen atmosphere, a treatment of the wafer with hydrogen at a temperature generally between 500 and 1200° C. and at a vacuum generally between 0.1 Pa and 60000 Pa, and preferably at a temperature of 850° C.±15° C. and at a vacuum of 11000 Pa±2000 Pa, for a time generally between 0.1 and 120 minutes, and most preferably between 0.5 and 1.5 minutes.

This treatment effectively removes substantially any and all the oxygen that may have combined with the silicon on the surface of the monocrystalline silicon during the loading inside the heated chamber of the reactor even if it is done under a nitrogen flux.

After such a hydrogen treatment, another treatment is carried out substantially under the same vacuum conditions and at a temperature generally between 700 and 1000° C. with nitrogen protoxide ($N_2O$) for a time generally between 0.1 and 120 minutes, preferably between 0.5 and 1.5 minutes.

It has been found that the treatment with nitrogen protoxide ($N_2O$) at such a vacuum and temperature conditions causes a relatively slow oxidation of the monocrystalline silicon such to allow an effective control of the amount of oxygen at the interface and a great uniformity of distribution of it on the surface. The tunnel barrier characteristics in respect to the holes of the so created oxide film at the interface between the monocrystalline silicon and the polysilicon layer show an outstanding reproducibility.

BRIEF DESCRIPTION OF THE DRAWINGS

The invention is more precisely defined in the attached claims, while aspects and advantages will become even more evident through the following description of several embodiments and by referring to the attached drawings.

DETAILED DESCRIPTION OF THE PREFERRED EMBODIMENTS

An aspect of the invention is to pre-oxidize the silicon in a $N_2O$ atmosphere instead of using hydrogen peroxide according to prior art. By carrying out the treatment with $N_2O$ at a relatively low temperature, the monocrystalline silicon is oxidized with a kinetic that is sufficiently slow and amenable to allow a precise control of the amount of oxygen at the interface after polysilicon deposition.

A reduced kinetic and the "dilution" due to the concurrent presence of nitrogen at the interface together with oxygen, are the two factors that probably determine the outstanding reproducibility and relative uniformity of the characteristics of the fabricated devices. The possibility of using of nitrogen protoxide ($N_2O$) for common nitration treatments instead of toxic nitrogen oxide (NO) is known, however such known treatments are generally carried out at a temperature above 1000° C.

Figure 1:
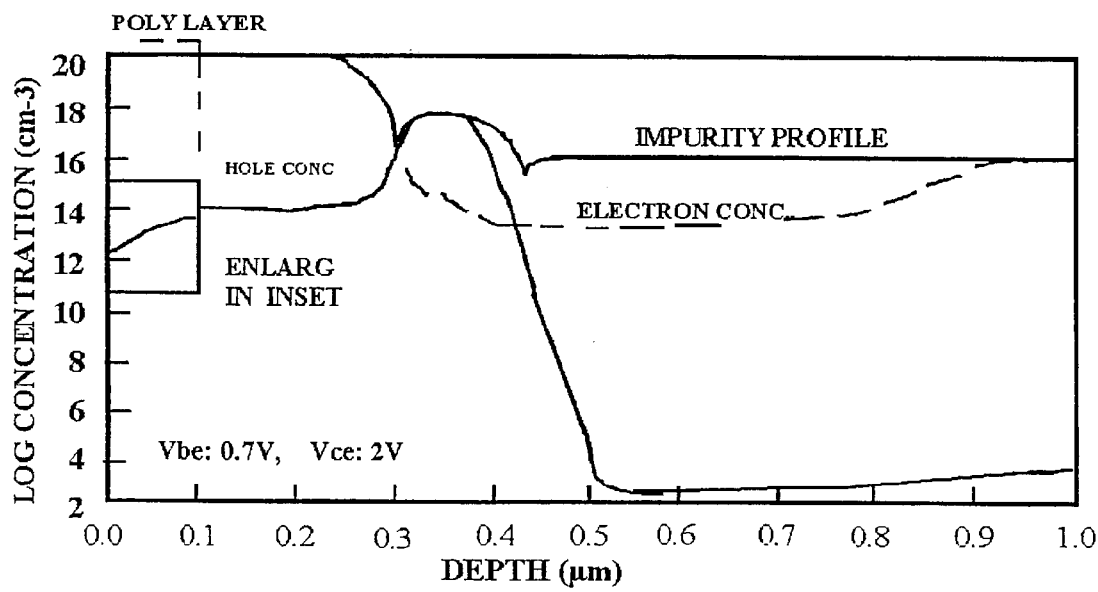
FIG. 1 is a diagram showing holes distribution in a poly-emitter device.
Figure 2:
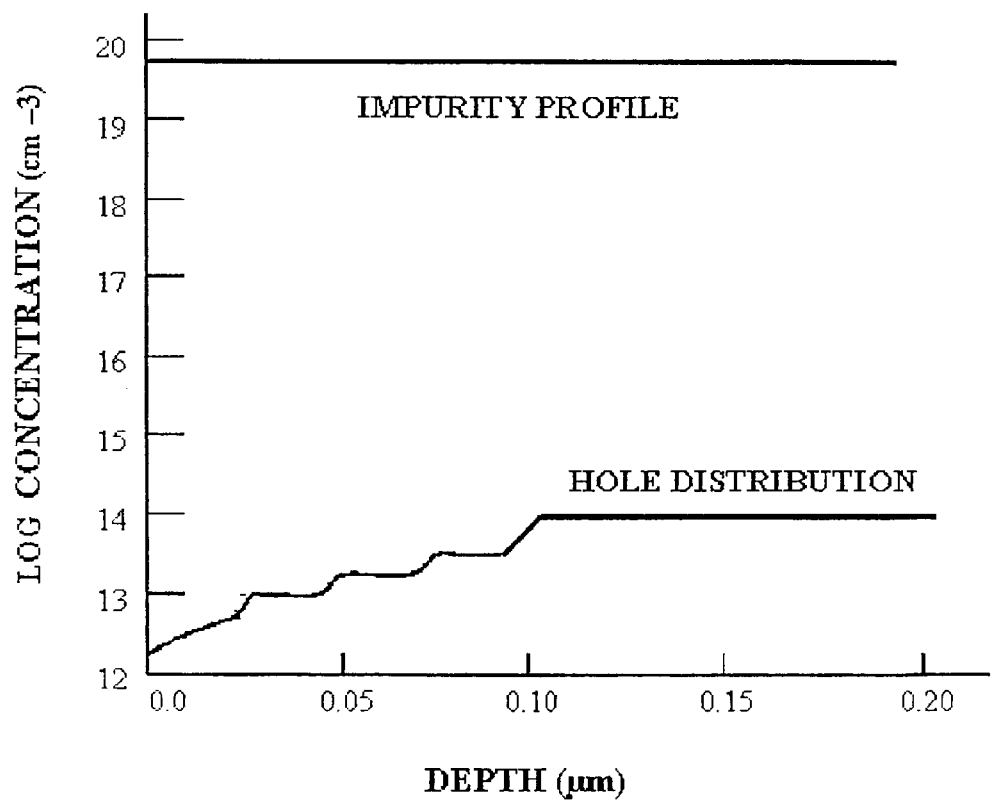
FIG. 2 is a diagram showing the holes distribution in the polysilicon layer.
Figure 3:
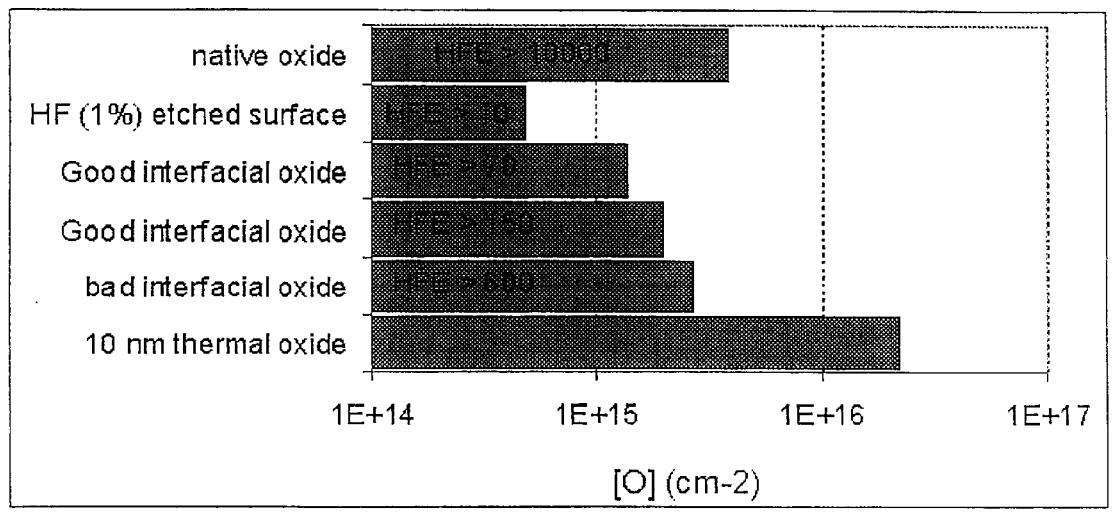
FIG. 3 is a diagram showing the oxygen concentration values at the interface for different treatments and the corresponding values of HFE of the devices.
Figure 4:
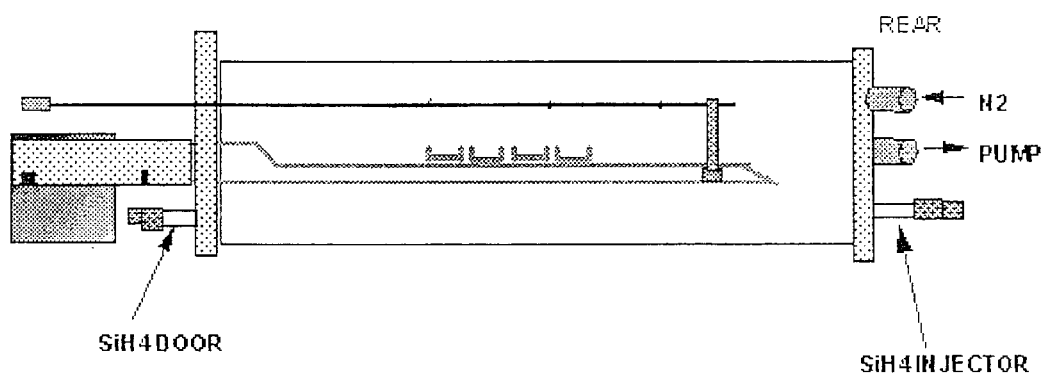
FIG. 4 is a schematic diagram showing the scheme of a conventional LPCVD reactor.
Figure 5:
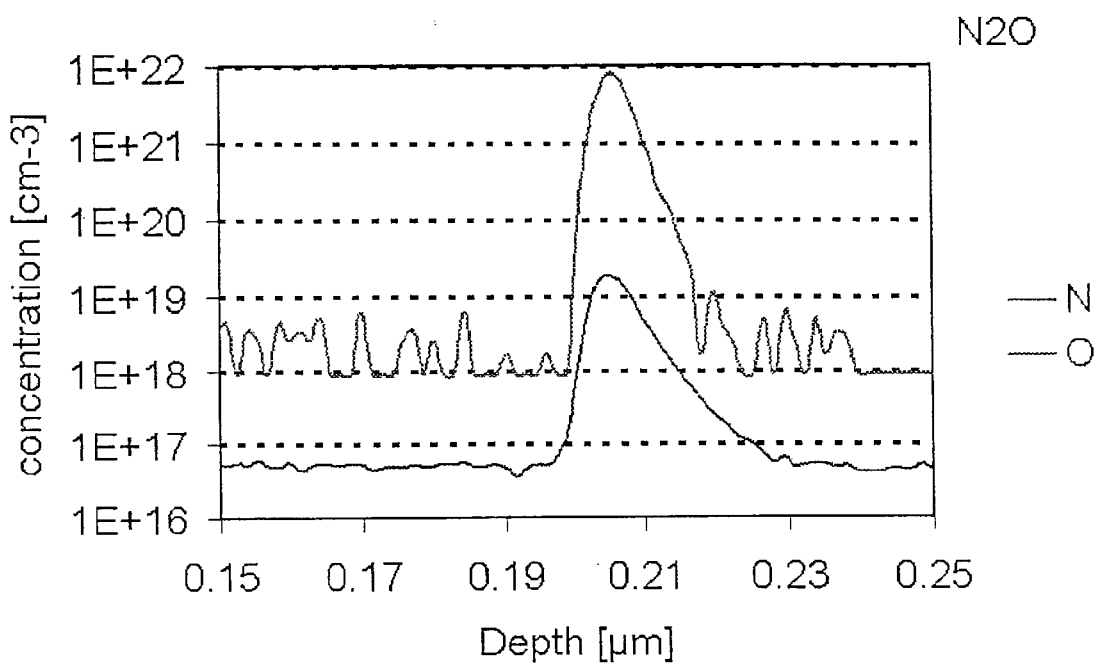
FIG. 5 is a diagram showing SIMS profiles of oxygen and nitrogen at the interface between the monocrystalline silicon and the polysilicon that are obtained with the process of the present invention.

From the SIMS curves of analytical determination of the amounts of nitrogen and oxygen present on the surface of the treated monocrystalline silicon of FIG. 5, a significative presence of nitrogen atoms along with oxygen atoms is confirmed. The concurrent presence of nitrogen seems to play a fundamental role in retarding oxidation of the silicon and the eventual formation of a film of oxide onto the silicon surface and in making the rate of such an oxidation process more uniform over the whole silicon surface.

Figure 6:
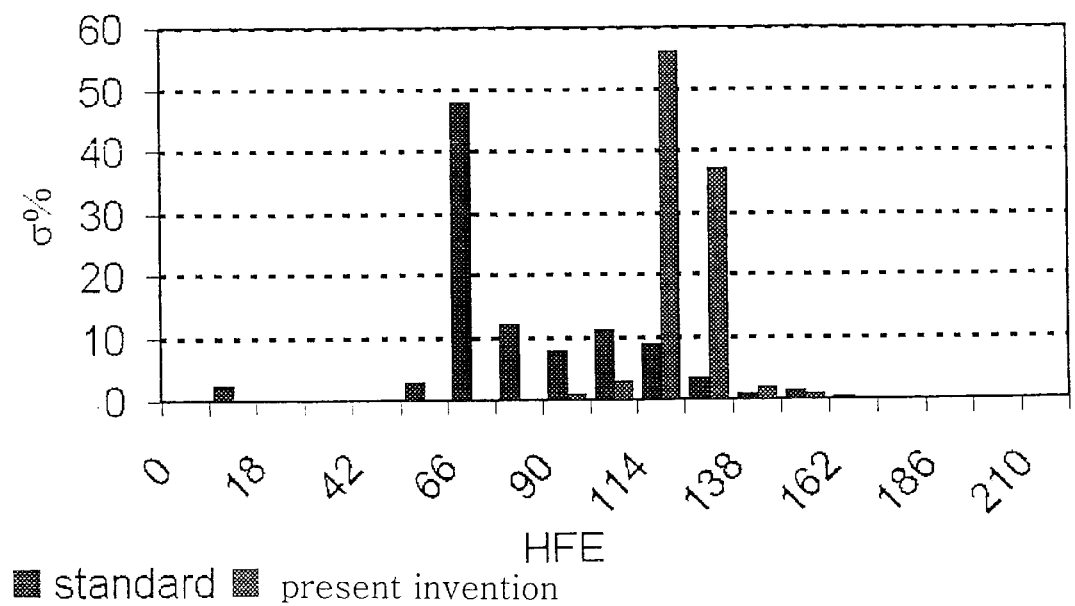
FIG. 6 is a diagram showing the spread of the values of HFE in the case of a known process and in the case of the process of the invention.
Figure 7:
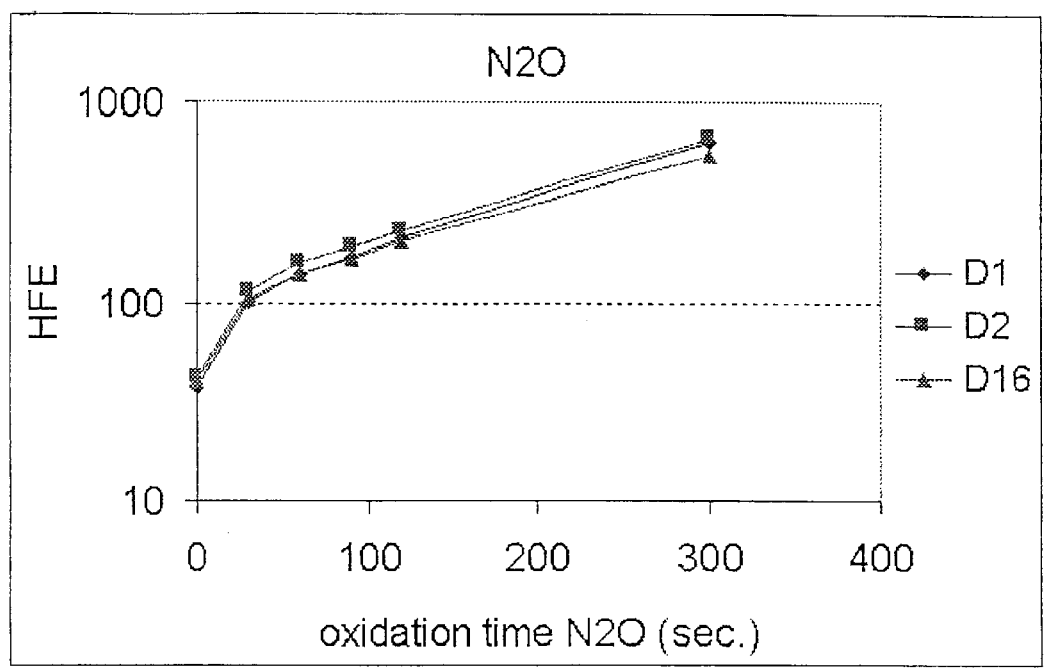
FIG. 7 is a diagram showing the HFE values as a function of the duration of the treatment with nitrogen protoxide for devices of different size in accordance with the present invention.
Figure 8:
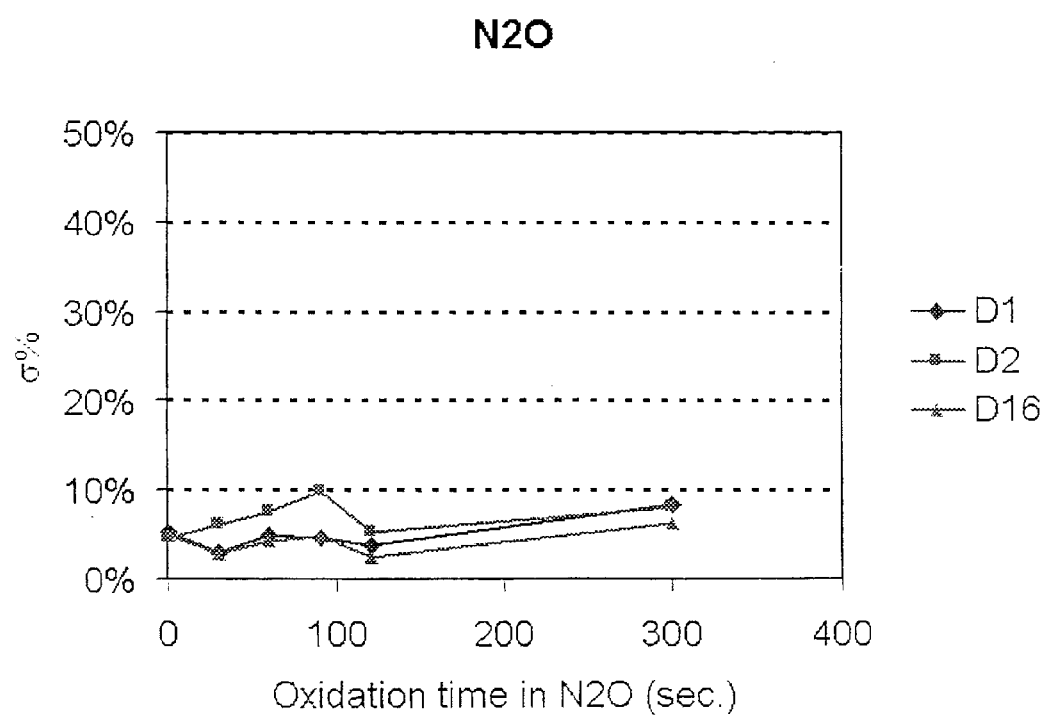
FIG. 8 is a diagram showing spread of HFE values as a function of the duration of the treatment with nitrogen oxide for devices of different size in accordance with the present invention.

The reduced oxidation kinetic of the process of the invention has effects that may be best appreciated from the diagram of FIG. 6. The transistors made according to the method of the invention have highly reproducible HFE values. The current gain and relative spread characteristics as a function of the duration of the pre-conditioning treatment with $N_2O$ of the surface of the monocrystalline silicon, for three different devices, indicated with D1, D2 and D16, having dimensions of respectively 1×8 μm, 1×2 μm and 2.6×8 μm, respectively, are shown in FIGS. 7 and 8.

Figure 9:
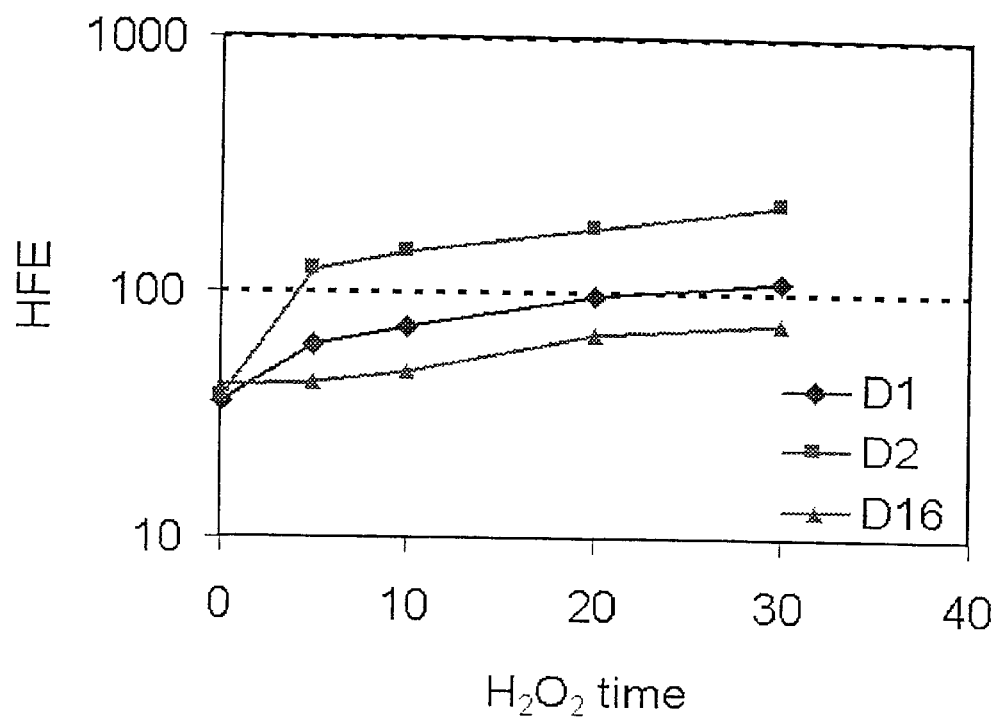
FIG. 9 is a diagram showing for comparison purposes the HFE values as a function of the duration of the treatment with hydrogen peroxide for devices of different size made according to a known technique.

By modifying the duration of the $N_2O$ treatment it is possible to regulate in a relatively precise manner the value of HFE within a relatively wide range of values, substantially independently from the actual size of the devices. Moreover the dispersion of the values of current gain (spread) is contained within 10% range, for the three devices of different size. This cannot be achieved even with the best known processes using a conditioning treatment (pre-oxidation) of the silicon wafer with hydrogen peroxide. The diagram of FIG. 9, of the current gain as a function of the oxidation time for three devices of different sizes as those of D1, D2, D16, shows that the devices that were treated with hydrogen peroxide according to the known method show values of HFE that are clearly tied to the dimensions of the device.

Figure 10:
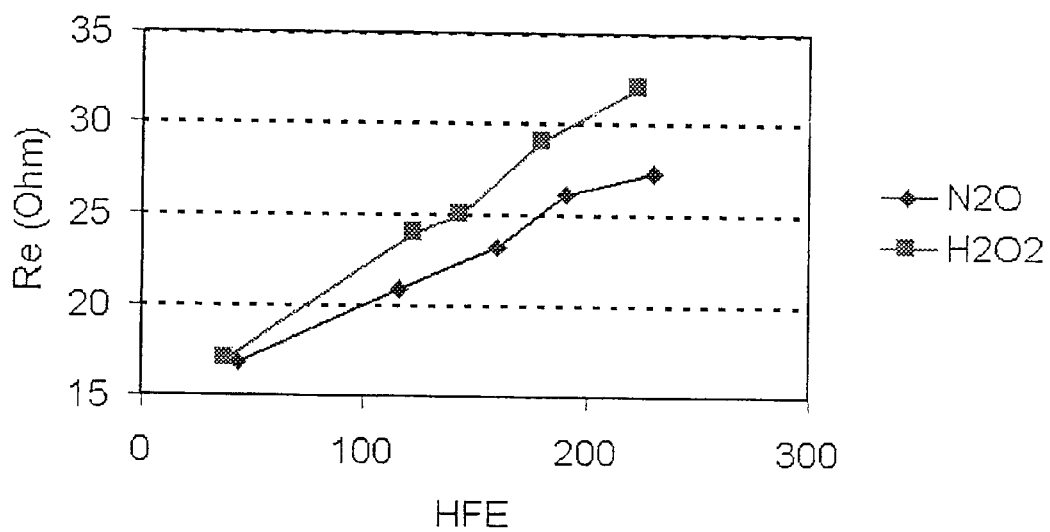
FIG. 10 is a diagram of the variation of the emitter resistance RE in function of HFE for treatments with hydrogen peroxide and nitrogen oxide.
Figure 11:
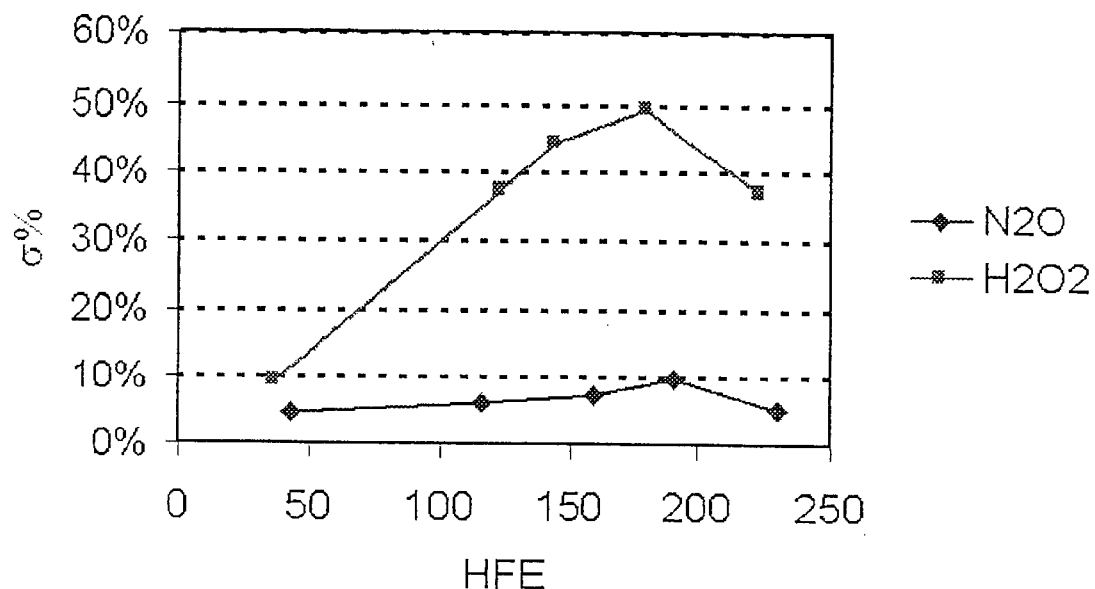
FIGS. 11 and 12 are diagrams comparing the statistical dispersion of the values of HFE and of RE that are obtained with a hydrogen peroxide treatment of the prior art and with the nitrogen oxide treatment of the invention.
Figure 12:
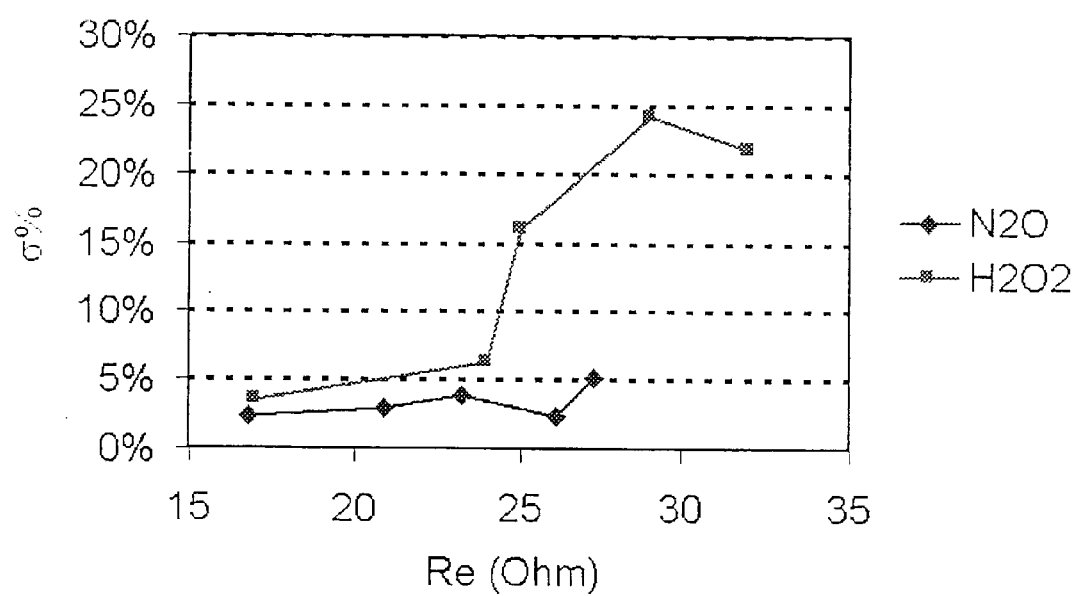

Moreover, as highlighted in FIG. 10, to such a variability of the value of HFE there is also a undesirable variability of the emitter resistance RE that is much more accentuated in the case of treatment with hydrogen peroxide than in the case of treatment with nitrogen oxide, according to the present invention. Looking at the diagrams of FIGS. 11 and 12, it may be clearly noticed that the statistical dispersions (spread) of the current gain (HFE) values and of the emitter resistance values RE are definitely smaller for the pre-conditioning treatment of the silicon wafer surface according to the process of the invention. In fact, transistors realized according to the known method relying on a treatment with hydrogen peroxide, have current gains and emitter resistances with a statistical dispersion (spread) that may be up to 5 times greater than the statistical dispersion for transistors realized with the improved process of the invention.

That which is claimed is:

1. A method for controlling the amount and the uniformity of distribution of oxygen atoms at an interface between an emitter region of a surface of a monocrystailine silicon wafer and a layer of polysilicon deposited thereon by a low pressure chemical vapor deposition technique, the method comprising:

cleaning and passivating the surface of the monocrystalline silicon wafer with hydrofluoric acid;

rinsing and drying the monocrystalline silicon wafer;

loading the monocrystalline silicon wafer inside a reactor for chemical vapor deposition;

evacuating the reactor at a vacuum between 0.1 Pa and 15000 Pa;

passivating the surface of the monocrystalline silicon wafer with hydrogen at a vacuum between 0.1 Pa and 60000 Pa and at a temperature between 500 and 1200° C., for a time between 0.1 and 120 minutes;

exposing the passivated surface of the monocrystalline silicon wafer to an atmosphere of nitrogen protoxide ($N_2O$) for a time between 0.1 and 120 minutes at a vacuum between 0.1 Pa and 60000 Pa and at a temperature between 700 and 1000° C.;

lowering a temperature inside the reactor until reaching a value between 500° C. and 800° C. before starting the deposition of polysilicon;

raising the temperature inside the reactor and depositing the polysilicon; and keeping an atmosphere of a gas in the reactor during the evacuating and heating, the gas comprising at least one of nitrogen, argon, and helium.

2. The method of claim 1, wherein the passivated surface of the monocrystalline silicon wafer is exposed to the atmosphere of nitrogen protoxide ($N_2O$) at a vacuum of about 11000 Pa and at a temperature of about 850° C.

3. The method of claim 1, wherein the hydrofluoric acid comprises a 1% by weight aqueous solution of hydrofluoric acid.

4. A method of fabricating a semiconductor integrated circuit device including poly-emitter bipolar transistors, the method comprising:

forming an emitter region on a surface of a monocrystalline silicon wafer; and controlling an amount and uniformity of distribution of oxygen atoms at an interface between the emitter region of the surface of the monocrystalline silicon wafer and a layer of polysilicon subsequently deposited thereon via low pressure chemical vapor deposition, and comprising cleaning and passivating the surface of the monocrystalline silicon wafer with hydrofluoric acid, rinsing and drying the monocrystalline silicon wafer, loading the monocrystalline silicon wafer inside a reactor for chemical vapor deposition, evacuating the reactor at a vacuum between 0.1 Pa and 15000 Pa, passivating the surface of the monocrystalline silicon wafer with hydrogen at a vacuum between 0.1 Pa and 60000 Pa and at a temperature between 500 and 1200° C., for a time between 0.1 and 120 minutes, exposing the passivated surface of the monocrystalline silicon wafer to an atmosphere of nitrogen protoxide ($N_2O$) for a time between 0.1 and 120 minutes at a vacuum between 0.1 Pa and 60000 Pa and at a temperature between 700 and 1000°C., lowering a temperature inside the reactor until reaching a value between 500° C. and 800° C. before starting the deposition of polysilicon, raising the temperature inside the reactor and depositing the polysilicon, and keeping an atmosphere of a gas in the reactor during the evacuating and heating, the gas comprising at least one of nitrogen, argon, and helium.

5. The method of claim 4, wherein the passivated surface of the monocrystalline silicon wafer is exposed to the atmosphere of nitrogen protoxide ($N_2O$) at a vacuum of about 11000 Pa and at a temperature of about 850° C.

6. The method of claim 4, wherein the hydrofluoric acid comprises a 1% by weight aqueous solution of hydrofluoric acid.

7. A method of depositing a layer of polysilicon on a surface of a monocrystalline silicon wafer, the method comprising:

loading the monocrystalline silicon wafer inside a chemical vapor deposition reactor;

evacuating the reactor at a vacuum between 0.1 Pa and 15000 Pa; treating the surface of the monocrystalline silicon wafer with hydrogen at a vacuum between 0.1 Pa and 60000 Pa and at a temperature between 500 and 1200° C., for a time between 0.1 and 120 minutes;

exposing the passivated surface of the monocrystalline silicon wafer to an atmosphere of nitrogen protoxide ($N_2O$) for a time between 0.1 and 120 minutes at a vacuum between 0.1 Pa and 60000 Pa and at a temperature between 700 and 1000° C.; and raising the temperature inside the reactor and depositing the polysilicon.

8. The method according to claim 7 further comprising providing an atmosphere of a gas in the reactor during the evacuating and heating, the gas comprising at least one of nitrogen, argon, and helium.

9. The method according to claim 7 further comprising treating the surface of the monocrystalline silicon wafer with hydrofluoric acid, and rinsing and drying the monocrystalline silicon wafer before loading the monocrystalline silicon wafer inside the chemical vapor deposition reactor.

10. The method according to claim 7 further comprising lowering a temperature inside the reactor until reaching a value between 500° C. and 800° C. before raising the temperature inside the reactor and depositing the polysilicon.

11. The method according to claim 7, wherein the passivated surface of the monocrystalline silicon wafer is exposed to the atmosphere of nitrogen protoxide ($N_2O$) at a vacuum of about 11000 Pa and at a temperature of about 850° C.

12. The method according to claim 7, wherein the hydrofluoric acid comprises a 1% by weight aqueous solution of hydrofluoric acid.

13. A method of fabricating a semiconductor integrated circuit device including a poly-emitter bipolar transistor, the method comprising:

forming an emitter region on a surface of a monocrystalline silicon wafer;

loading the monocrystalline silicon wafer inside a chemical vapor deposition reactor;

evacuating the reactor at a vacuum between 0.1 Pa and 15000 Pa;

treating the surface of the monocrystalline silicon wafer with hydrogen at a vacuum between 0.1 Pa and 60000 Pa and at a temperature between 500 and 1200° C., for a time between 0.1 and 120 minutes;

exposing the passivated surface of the monocrystalline silicon wafer to an atmosphere of nitrogen protoxide ($N_2O$) for a time between 0.1 and 120 minutes at a vacuum between 0.1 Pa and 60000 Pa and at a temperature between 700 and 1000° C.; and raising the temperature inside the reactor and depositing polysilicon.

14. The method according to claim 13 further comprising providing an atmosphere of a gas in the reactor during the evacuating and heating, the gas comprising at least one of nitrogen, argon, and helium.

15. The method according to claim 13 further comprising treating the surface of the monocrystalline silicon wafer with hydrofluoric acid, and rinsing and drying the monocrystalline silicon wafer before loading the monocrystalline silicon wafer inside the chemical vapor deposition reactor.

16. The method according to claim 13 further comprising lowering a temperature inside the reactor until reaching a value between 500° C. and 800° C. before raising the temperature inside the reactor and depositing the polysilicon.

17. The method according to claim 13, wherein the passivated surface of the monocrystalline silicon wafer is exposed to the atmosphere of nitrogen protoxide ($N_2O$) at a vacuum of about 11000 Pa and at a temperature of about 850° C.

18. The method according to claim 13, wherein the hydrofluoric acid comprises a 1% by weight aqueous solution of hydrofluoric acid.

* * * * *

UNITED STATES PATENT AND TRADEMARK OFFICE
CERTIFICATE OF CORRECTION

PATENT NO.     : 6,642,121 B2
DATED          : November 4, 2003
INVENTOR(S)    : Cateno M. Camalleri et al.

It is certified that error appears in the above-identified patent and that said Letters Patent is hereby corrected as shown below:

Column 7,
Line 29, delete "evacuating the reactor at a vacuum between 0.1 Pa and 15000 Pa; treating the surface of the monocrystalline silicon wafer with hydrogen at a vacuum between 0.1 Pa and 60000 Pa and at a temperature between 500 and 1200°C., for a time between 0.1 and 120 minutes;" insert
-- evacuating the reactor at a vacuum between 0.1 Pa and 15000 Pa;
   treating the surface of the monocrystalline silicon wafer with hydrogen at a
      vacuum between 0.1 Pa and 60000 Pa and at a temperature between 500
      and 1200°C, for a time between 0.1 and 120 minutes; --

Column 8,
Line 22, delete "C.," insert -- C, --
Line 28, delete "C.;" insert -- C; --
Line 42, delete "C. and 800° C." insert -- C and 800° C --

Signed and Sealed this

Sixteenth Day of March, 2004

JON W. DUDAS
*Acting Director of the United States Patent and Trademark Office*

UNITED STATES PATENT AND TRADEMARK OFFICE
CERTIFICATE OF CORRECTION

PATENT NO.     : 6,642,121 B2
DATED          : November 4, 2003
INVENTOR(S)    : Cateno M. Camalleri et al.

It is certified that error appears in the above-identified patent and that said Letters Patent is hereby corrected as shown below:

Column 6,
Line 12, delete "monocrystailine" insert -- monocrystalline --
Line 27, delete "C.," insert -- C, --
Line 32, delete "C.;" insert -- C; --
Line 34, delete "C. and 800º C." insert -- C and 800º C --

Column 7,
Line 4, delete "C.," insert -- C, --
Lines 11 and 52, delete "C. and 800º C." insert -- C and 800º C --
Line 29, delete "evacuating the reactor at a vacuum between 0.1 Pa and 15000 Pa; treating the surface of the monocrystalline silicon wafer with hydrogen at a vacuum between 0.1 Pa and 60000 Pa and at a temperature between 500 and 1200ºC., for a time between 0.1 and 120 minutes;" insert
-- evacuating the reactor at a vacuum between 0.1 Pa and 15000 Pa;
    treating the surface of the monocrystalline silicon wafer with hydrogen at a
        vacuum between 0.1 Pa and 60000 Pa and at a temperature between 500
        and 1200ºC, for a time between 0.1 and 120 minutes; --
Line 38, delete "C.;" insert -- C; --

Column 8,
Line 22, delete "C.," insert -- C, --
Line 28, delete "C.;" insert -- C; --
Line 42, delete "C. and 800º C." insert -- C and 800º C --

This certificate supersedes Certificate of Correction issued March 16, 2004.

Signed and Sealed this

Twenty-ninth Day of June, 2004

JON W. DUDAS
*Acting Director of the United States Patent and Trademark Office*